United States Patent
Tu et al.

(10) Patent No.: US 7,030,444 B2
(45) Date of Patent: Apr. 18, 2006

(54) SPACE PROCESS TO PREVENT THE REVERSE TUNNELING IN SPLIT GATE FLASH

(75) Inventors: Kuo-Chi Tu, Hsin-Chu (TW);
Wen-Ting Chu, Kaohsiung (TW);
Yi-Shing Chang, Hsin-Chu (TW);
Yi-Jiun Lin, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 10/786,798

(22) Filed: Feb. 25, 2004

(65) Prior Publication Data

US 2005/0184331 A1  Aug. 25, 2005

(51) Int. Cl.
*H01L 29/788* (2006.01)

(52) U.S. Cl. .................. 257/315; 257/57; 257/201; 257/316; 257/321; 257/325; 438/266; 438/302; 438/532; 438/701; 438/713

(58) Field of Classification Search ............... 257/315, 257/316, 319, 320, 321, 57, 201, 326, 325; 438/695, 701, 713, 257, 266, 302, 532
See application file for complete search history.

(56) References Cited

U.S. PATENT DOCUMENTS

| | | | | |
|---|---|---|---|---|
| 6,002,152 A | * | 12/1999 | Guterman et al. | 257/316 |
| 6,031,264 A | | 2/2000 | Chien et al. | 257/315 |
| 6,368,976 B1 | * | 4/2002 | Yamada | 438/713 |
| 6,380,030 B1 | | 4/2002 | Chen et al. | 438/257 |
| 6,400,603 B1 | | 6/2002 | Blyth et al. | 365/185.12 |
| 6,465,841 B1 | * | 10/2002 | Hsieh et al. | 257/321 |
| 6,479,346 B1 | * | 11/2002 | Yi et al. | 438/257 |
| 6,617,638 B1 | | 9/2003 | Chiang et al. | 257/316 |
| 6,620,689 B1 | * | 9/2003 | Lin | 438/266 |
| 6,753,223 B1 | * | 6/2004 | Lin | 438/257 |
| 6,855,966 B1 | * | 2/2005 | Chuang et al. | 257/201 |

\* cited by examiner

*Primary Examiner*—Mai-Huong Tran
(74) *Attorney, Agent, or Firm*—Thomas, Kayden, Horstemeyer & Risley

(57) ABSTRACT

A split gate flash memory cell structure is disclosed for prevention of reverse tunneling. A gate insulator layer is formed over a semiconductor surface and a floating gate is disposed over the gate insulator layer. A floating gate insulator layer is disposed over the floating gate and sidewall insulator spacers are disposed along bottom portions of the floating gate sidewall adjacent to said gate insulator layer. The sidewall insulator spacers are formed from a spacer insulator layer that had been deposited in a manner that constitutes a minimal expenditure of an available thermal budget and etching processes used in fashioning the sidewall insulator spacers etch the spacer insulator layer faster than the gate insulator layer and the floating gate insulator layer. An intergate insulator layer is disposed over exposed portions of the gate insulator layer, the floating gate, the floating gate insulator layer and the sidewall insulator spacers. A conductive control gate is disposed over the intergate insulator layer, covering about half of the floating gate.

12 Claims, 6 Drawing Sheets

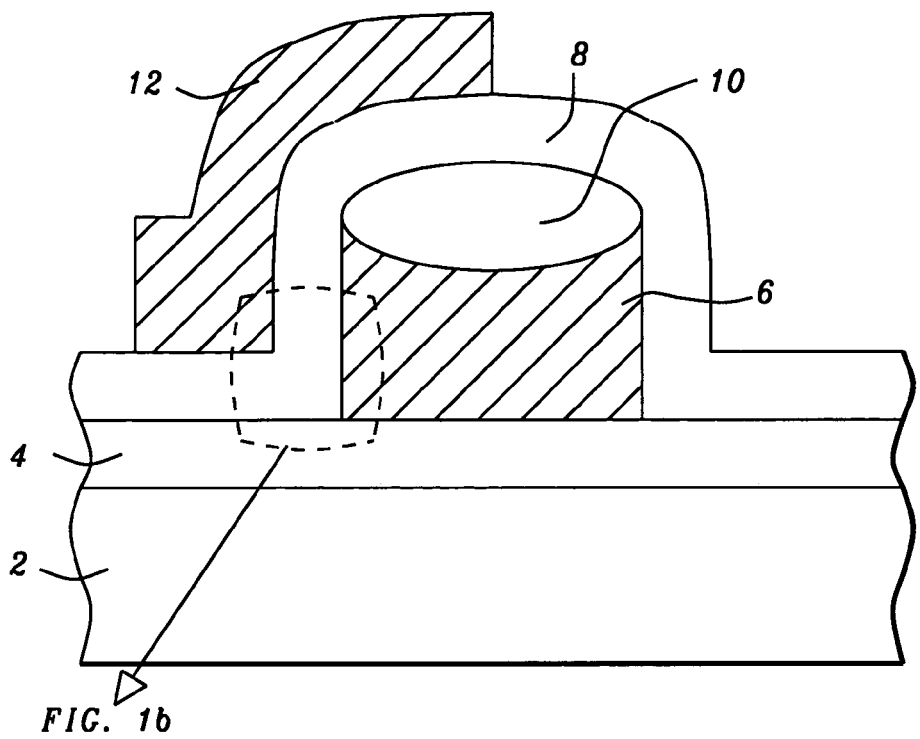
FIG. 1a – Prior Art
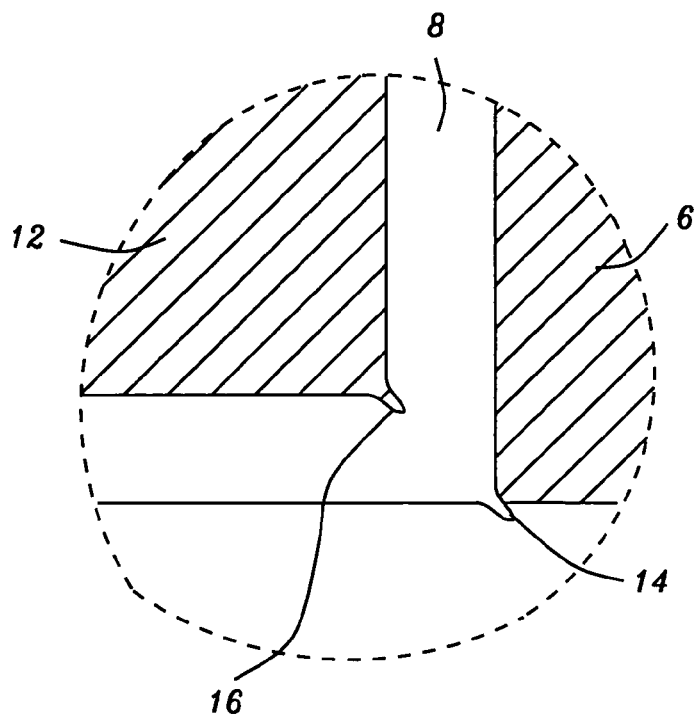
FIG. 1b – Prior Art

SPACE PROCESS TO PREVENT THE REVERSE TUNNELING IN SPLIT GATE FLASH

BACKGROUND OF THE INVENTION

(1) Field of the Invention

The present invention relates generally to semiconductor integrated circuit technology and more particularly to memory cells used in split gate flash EEPROMs (Electrically Erasable Programmable Read Only Memory).

(2) Description of Prior Art

In programming and erase operations used in split-gate flash memory cells, electrons are transferred into (programming) or out of (erasing) floating gates. As is well known in the art, this transfer of electrons is accomplished by tunneling through thin insulator layers separating the three basic components of a split-gate memory cell, namely: substrate, floating gate and control gate. The programming and erase operations are affected by the passage of electrons trough the intervening thin insulator layers by application of different voltage levels to the control gate and source and drain of the cell. It is important that no extraneous current paths exist that could interfere with the charge transfers of the programming and erasing operations. Such extraneous current paths can seriously impact device yield and reliability and steps need be taken to prevent the occurrence of extraneous current paths.

A common and persistent defect found in conventional split gate flash cells is shown in FIGS. 1a and 1b. This defect is appropriately denoted "poly tip" and it is what gives rise to an extraneous current that is commonly called "reverse tunneling". Shown in FIG. 1a is a typical structure for a conventional split gate flash cell. A floating gate, 6, is disposed over a gate oxide layer, 4, which had been formed over a silicon region, 2. A thermally grown poly oxide layer, 10, is disposed over the floating gate and an intergate insulator layer, 8, is deposited over the poly oxide layer, the floating gate sidewalls and the exposed gate oxide layer. A magnified view of the region where the poly tip occurs is shown in FIG. 1b. An etching of the poly layer and a wet dip, process steps used to form the floating gate, can give rise to an undercut, 14, of the floating gate. The undercut is replicated on the deposited intergate insulator layer, as shown in FIG. 1b. Another method of separating the control gate from the floating gate is to grow an oxide layer over the floating gate sidewalls, but the replication of the undercut would also occur in this method. In either method, when forming the control gate, 12, the undercut shape is filled with conductive material giving rise to a poly tip, 16.

Since the poly tip is a feature that causes reverse tunneling, it is important to devise split gate structures and processing methods that do not produce a poly tip. Prior art methods exist that produce structures that do not contain a poly tip or in which the affect of the poly tip is alleviated. This is usually accomplished by increasing the spacing between the control gate and the bottom of the floating gate, which can be done in various ways, such as, tapering the sides of the floating gate or by forming insulating barriers and spacers. These methods invariably involve extra processing steps and adding processing steps is inherently undesirable because of increased cost and decreased reliability. Moreover other problems could be introduced. For example, silicon nitride spacers could be used to alleviate the poly tip problem, but such spacers could give rise to undesirable excessive stress and the high nitride deposition temperature strains the present generation thermal budget limitations.

Chiang et al. U.S. Pat. No. 6,617,638 discloses a method of forming a split-gate flash memory cell with a tapered floating gate. The negatively tapered walls provide a geometry better suited for forming thicker spacers around the floating gate. Hsieh et al. U.S. Pat. No. 6,465,841 teaches a method to fabricate a split-gate flash memory cell with nitride spacers. U.S. Pat. No. 6,380,030 to Chen et al. shows an implant method for forming a silicon nitride spacer. U.S. Pat. No. 6,031,264 to Chien et al. discloses a nitride spacer for flash EPROM.

SUMMARY OF THE INVENTION

It is a primary objective of the invention to provide a method of forming split gate flash memory cells in which reverse tunneling does not occur. It is a further primary objective of the invention to provide a method of forming split gate flash memory cells in which poly tips do not occur. It is yet a further primary objective of the invention to provide a method of forming split gate memory cells in which reverse tunneling does not occur, which does not introduce any other problems and which is readily compatible with thermal budget limitations. It is another primary objective of the invention to provide a structure for split gate memory flash cells that can be fabricated so that reverse tunneling does not occur. It is yet another primary objective of the invention to provide a structure that can be fabricated so that poly tips do not occur. It is further yet another primary objective of the invention to provide a split gate flash memory cell structure that can be fabricated so that reverse tunneling does not occur, which does not introduce any other problems and which is compatible with thermal budget limitations.

These objectives are attained in the invention by the formation of an oxide spacer utilizing a two-step etching procedure. A deposited oxide layer is first subjected to an anisotropic dry etch which is followed by a wet etch to form a sidewall oxide spacer on the floating gate. The deposited oxide layer must have a higher wet etch rate than the thermal floating gate oxide and the thermal poly oxide. This oxide spacer prevents the formation of poly tips and consequently there is no reverse tunneling is observed. No other problems are introduced and the oxide deposition can be performed at moderate temperatures so the process is suitable to thermal budget limitations.

A split gate flash memory cell structure is disclosed for prevention of reverse tunneling. A gate insulator layer is formed over a semiconductor surface and a floating gate is disposed over the gate insulator layer. A floating gate insulator layer is disposed over the floating gate and sidewall insulator spacers are disposed along bottom portions of the floating gate sidewall adjacent to said gate insulator layer. The sidewall insulator spacers are formed from a spacer insulator layer that had been deposited in a manner that constitutes a minimal expenditure of an available thermal budget and etching processes used in fashioning the sidewall insulator spacers etch the spacer insulator layer faster than the gate insulator layer and the floating gate insulator layer. An intergate insulator layer is disposed over exposed portions of the gate insulator layer, the floating gate, the floating gate insulator layer and the sidewall insulator spacers. A conductive control gate is disposed over the intergate insulator layer, covering about half of the floating gate.

BRIEF DESCRIPTION OF THE DRAWINGS

In the accompanying drawing forming a material part of this description, there is shown:

FIGS. 1a and 1b show how a poly tip is formed in a traditional split gate flash memory cell structure.

DESCRIPTION OF THE PREFERRED EMBODIMENTS

Figure 2:
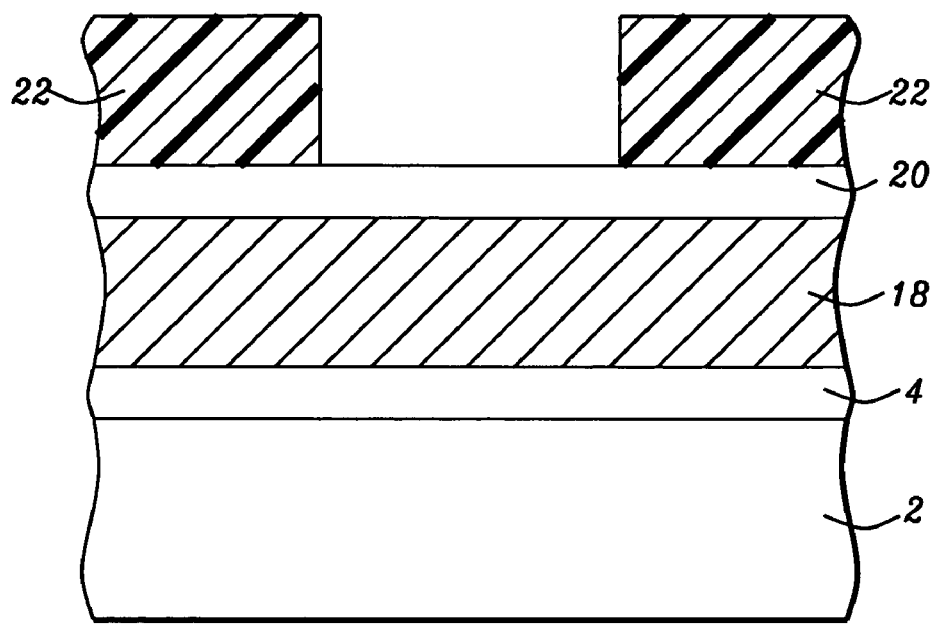
FIGS. 2–11 show a method for forming a split gate flash memory cell according to preferred embodiments of the invention.

Preferred embodiments of the invention are well described with the aid of FIGS. 2–11. Methods for forming split gate flash memory cell structures in which poly tips do not form are advantageously described with reference to FIGS. 2–11, in which cross-sectional views of the structure are shown at various stages of the fabrication process. FIG. 2 shows the structure prior to patterning and forming floating gates. A gate insulator layer, 4, is formed over a semiconductor region, 2, of a substrate. Preferably, the gate insulator layer is a tunneling oxide layer grown to a thickness of about 50 to 200 Angstroms over the semiconductor region, which preferably is a silicon region of a silicon substrate.

Figure 3:
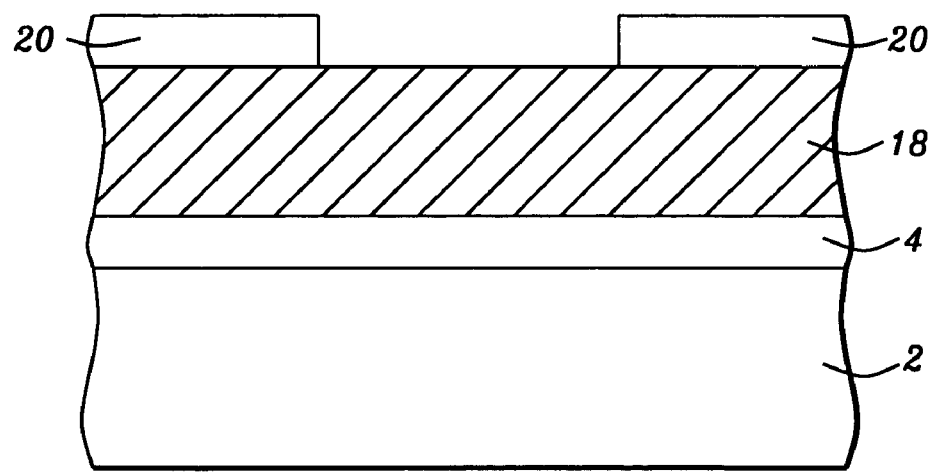
Figure 4:
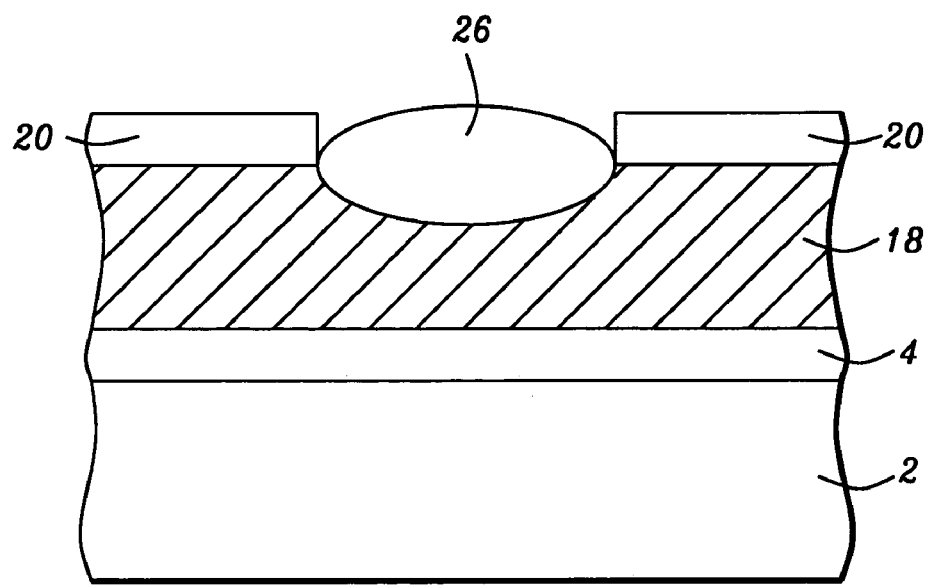
Figure 5:
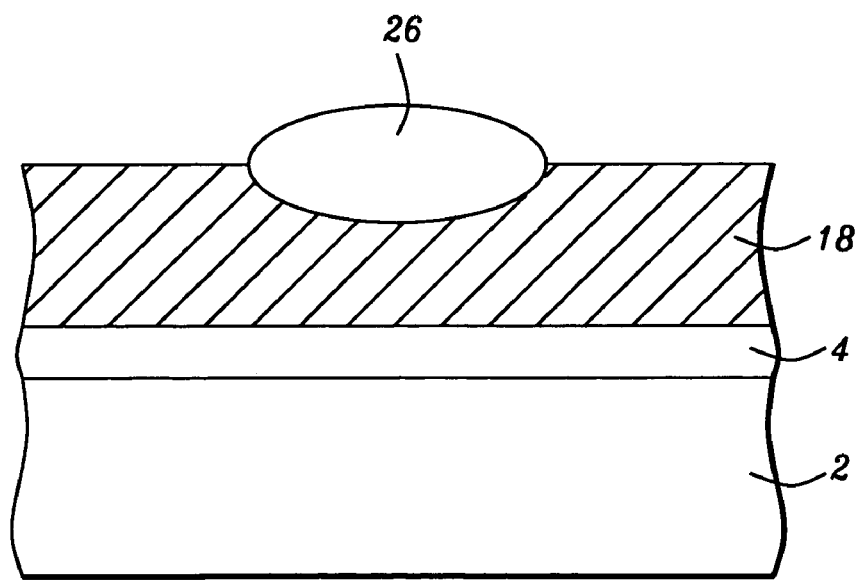
Figure 6:
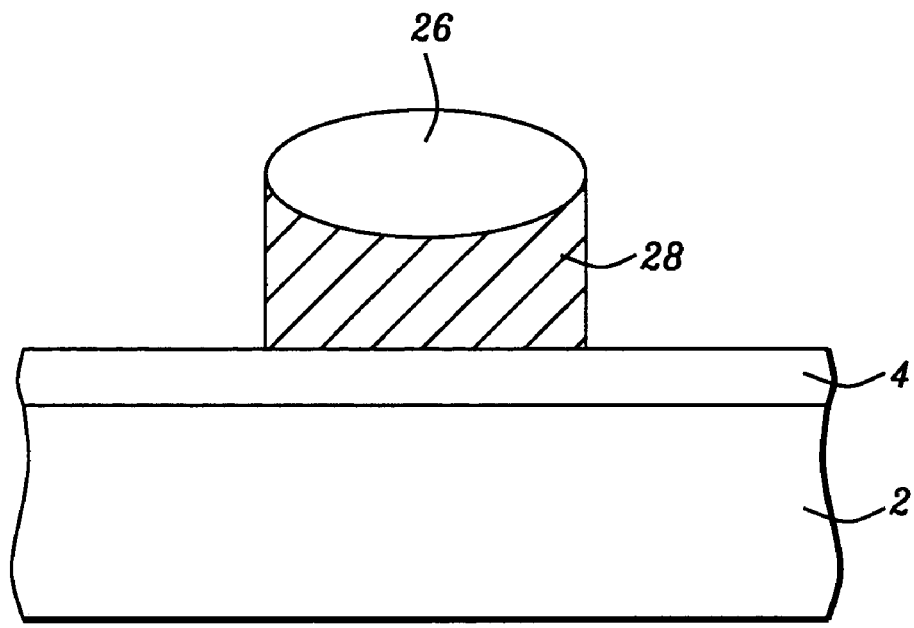

A first conductive layer, 18, which preferably is a deposited polysilicon layer, is formed over the first insulator layer. The first conductive layer will be utilized to form floating gates, 28, over which a floating gate insulating layer, 26, is disposed. In most preferred embodiments of the invention the formation of the floating gate and floating gate insulating layer is accomplished by first forming a hard mask insulator layer, 20, which preferably is a silicon nitride layer. Patterning of the hard mask insulator layer to achieve a floating gate pattern can preferably be accomplished by forming a photoresist layer, 22, patterning the photoresist layer and etching the hard mask insulator layer stopping at the first conductive layer and removing the photoresist layer. The structure is now as shown in FIG. 3. The floating gate insulator layer 26 is then formed as shown in FIG. 4. Preferably the floating gate insulator layer is formed by a wet oxidation of the polysilicon first conductive layer, 18, at a temperature in the range of about 800° C.–1000° C. to a thickness of about 800–2000 Angstroms. Removal of the remaining hard mask layer results in the structure shown in FIG. 5. Formation of the floating gate, 28, can now be completed by etching the first conductive layer using the floating gate insulator layer as a hard mask, which results in the structure shown in FIG. 6.

Figure 7:
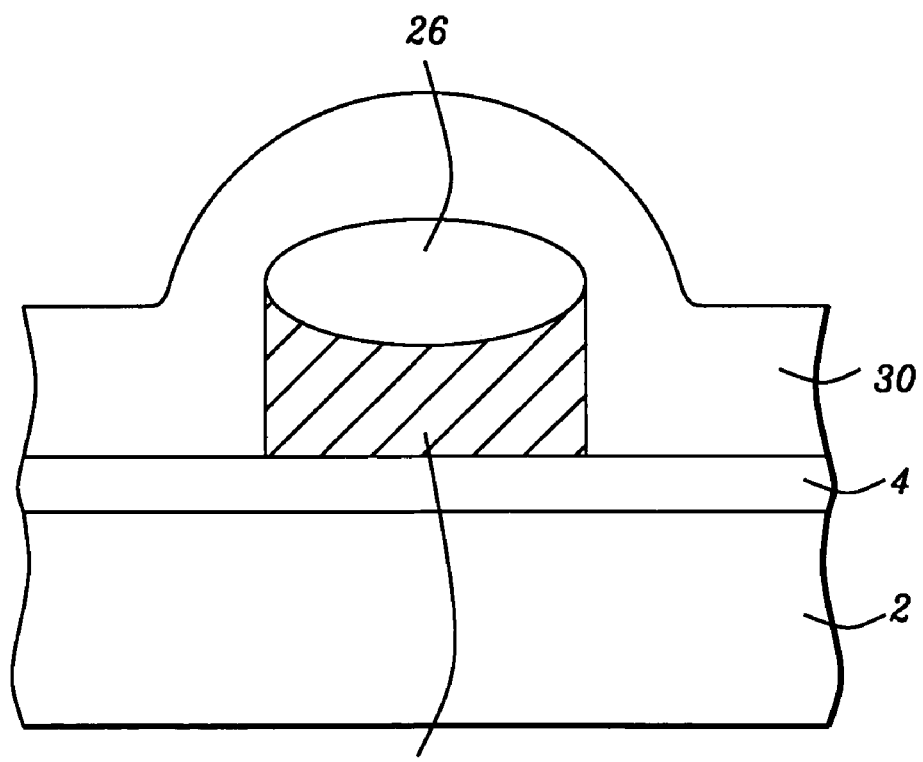

A spacer insulator layer, 30, is now formed as shown in FIG. 7, from which spacers, 34, conforming to preferred embodiments of the invention are to be fashioned. Preferably the spacer insulator layer is formed by a low temperature, i.e. less than about 500° C., deposition of oxide to a depth of about 800 to 1000 Angstroms, using processes such as PECVD and LPCVD that enable such low deposition temperatures. A key point of the invention is that deposition of the spacer insulator layer be performed using materials and deposition processes that can be accomplished at temperatures low enough so as not to strain the thermal budget. It is also crucial to the invention that the wet etch rate of the spacer insulator layer be larger than the wet etch rate of the gate insulator layer and of the floating gate insulator layer. In preferred embodiments of the invention in which the gate insulator layer is a thermally grown oxide and the floating gate insulator layer is a thermally grown poly oxide, the difference in etch rate is realized when the spacer insulator layer is a deposited oxide layer such as a PECVD or a LPCVD oxide layer. Wet etch rates of PECVD and LPCVD oxides are significantly larger than wet etch rates of thermal oxides. A major advantage of deposited oxide films such as PECVD or LPCVD oxide films is that deposition temperatures can be less than 500° C. so that these processes hardly impact the thermal budget. Traditional silicon nitride spacers used to prevent reverse tunneling require deposition temperatures in excess of about 700° C., which constitutes a significantly higher thermal budget expenditure. In addition, nitride spacers can introduce excessive stress, which does not occur with an oxide spacer.

Figure 8:
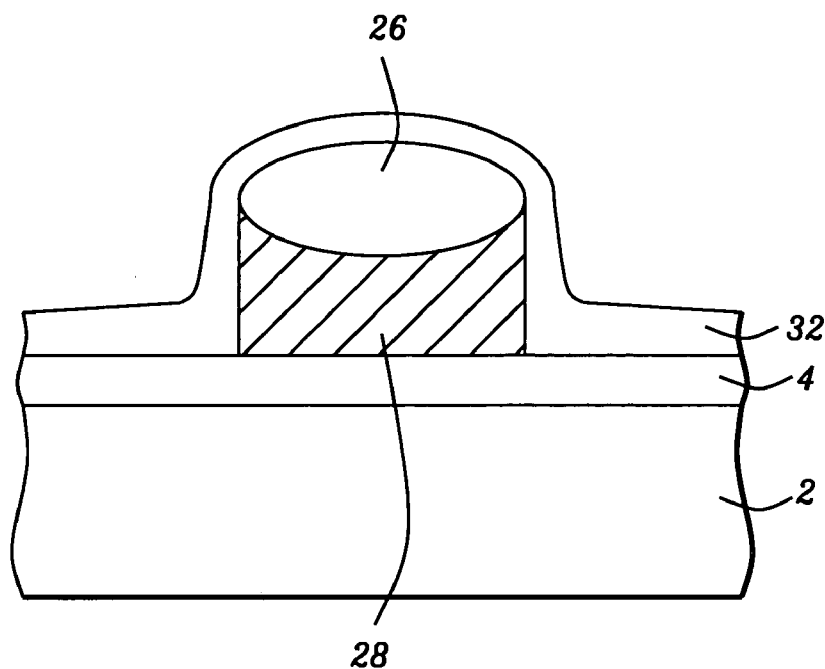
Figure 9:
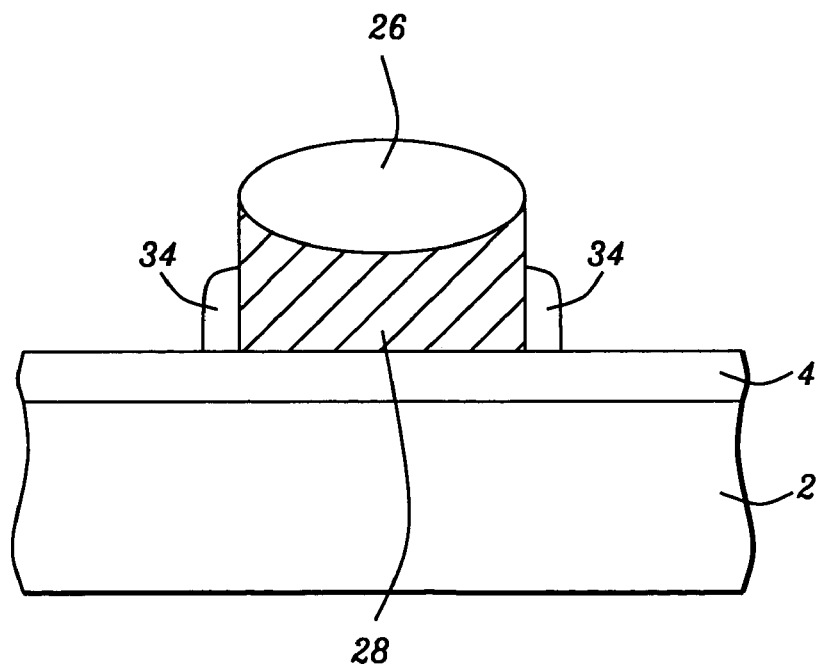
Figure 10:
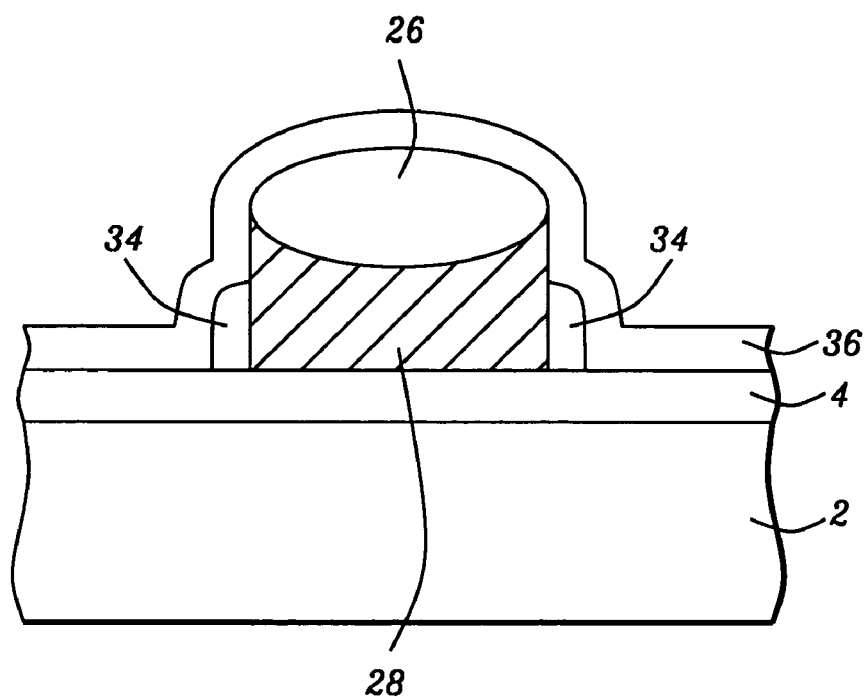

Forming spacers from the spacer insulator layer according to the invention involves a two-stage etching process. First an anisotropic dry etch is performed to reduce the spacer insulator layer thickness to achieve a profile, 32, as shown in FIG. 8. This is a partial etch, the spacer insulator layer should not be entirely removed anywhere in this first stage of the etch process. A second stage wet etch follows to form sidewall insulator spacers, 34, on the floating gate, 28. The reason for the requirement of a higher wet etch rate for the spacer insulator layer than for the gate insulator layer and for the floating gate insulator layer is apparent. Otherwise the wet etch could reduce the gate insulator layer and the floating gate insulator layer, which would be detrimental.

Figure 11:
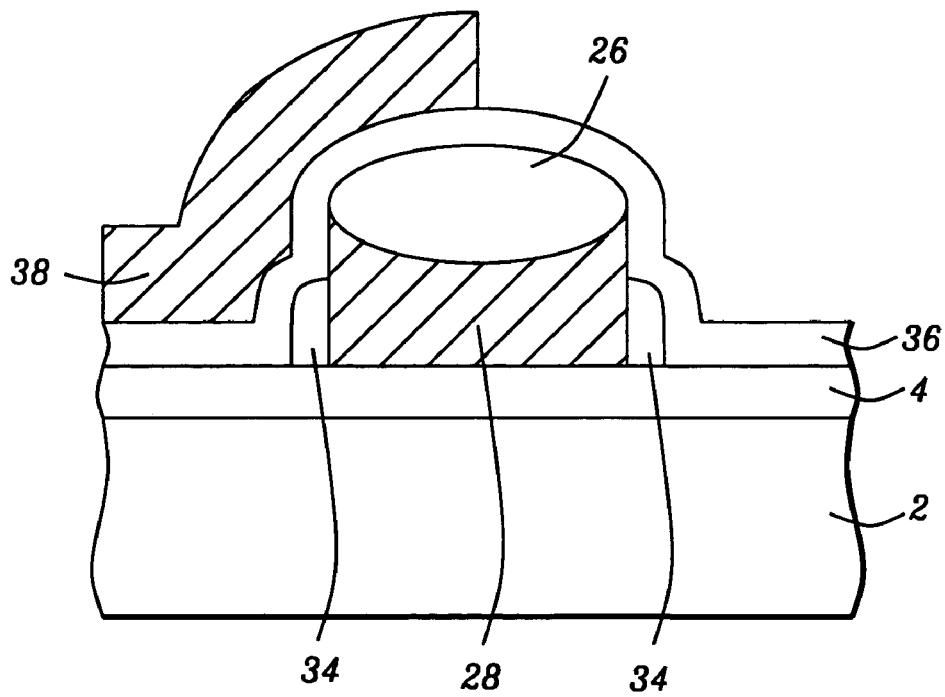

Next a blanket interpoly insulator layer, 36, which preferably is an oxide layer, is deposited. This is followed by deposition and patterning of a control gate, 38, that is disposed over the interpoly insulator layer and, as shown in FIG. 11, is above about half of the floating gate. Poly tips do not occur for spacers fabricated according to the invention and reverse currents are not observed.

While the invention has been particularly shown and described with reference to the preferred embodiments thereof, it will be understood by those skilled in the art that various changes in form and detail may be made without departing from the spirit and scope of the invention.

What is claimed is:

1. A spilt gate flash memory cell structure comprising:
    a semiconductor region within a substrate extending to a surface;
    a gate insulator layer formed over said semiconductor surface;
    a conductive floating gate disposed over said gate insulator layer;
    a floating gate insulator layer disposed over said floating gate;
    sidewall insulator spacers disposed along bottom portions of sidewalls of said floating gate on said gate insulator and not along top portions of sad sidewalls of said floating gate;
    an intergate insulator layer disposed over exposed portions of said gate insulator layer, said floating gate insulator layer and said sidewall insulator spacers; and
    a conductive control gate disposed over said intergate insulator layer and covering a portion of said floating gate.

2. The structure of claim 1 wherein said semiconductor region is a silicon region.

3. The structure of claim 1 wherein said substrate is a silicon containing substrate.

4. The structure of claim 1 wherein said gate insulator layer is a thermally grown oxide layer grown to a thickness of about 50 to 200 angstrons.

5. The structure of claim 1 wherein said conductive floating gate is composed of polysilicon.

6. The structure of claim 1 wherein said floating gate insulator layer is a grown polysilicon oxide layer grown to a thickness of about 800 to 2000 Angatroms.

7. The structure of claim 1 wherein said spacer insulator is an oxide layer.

8. The structure of claim 1 wherein said spacer insulator layer is a PECVD oxide layer.

9. The structure of claim 1 wherein said spacer insulator layer is a deposited oxide layer, said gate insulator layer is a thermal oxide layer and said floating gate insulator layer is a polysilicon oxide layer.

10. The structure of claim 1 wherein said intergate insulator layer is an oxide layer.

11. The structure of claim 1 wherein said conductive control gate is composed of polysilicon.

12. A spilt gate flash memory cell structure comprising:
   a semiconductor region within a substrate extending to a surface;
   a gate insulator layer formed over said semiconductor surface;
   a conductive floating gate disposed over said gate insulator layer, the gate insulator layer extending outside of the conductive floating gate;
   a floating gate insulator layer disposed over said floating gate;
   sidewall insulator spacers disposed along bottom portions of sidewalls of said floating gate adjacent said gate insulator layer and not along top portions of said sidewalls of said floating gate;
   an intergate insulator layer disposed over exposed portions of said gate insulator layer, said floating gate insulator layer and said sidewall insulator spacers; and
   a conductive control gate disposed over said intergate insulator layer and covering a portion of said floating gate.

* * * * *